(12) United States Patent
Bedau

(10) Patent No.: US 10,069,068 B2
(45) Date of Patent: Sep. 4, 2018

(54) DIFFUSED RESISTIVE MEMORY CELL WITH BURIED ACTIVE ZONE

(71) Applicant: HGST Netherlands B.V., Amsterdam (NL)

(72) Inventor: Daniel Bedau, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/145,648

(22) Filed: May 3, 2016

(65) Prior Publication Data

US 2017/0324033 A1    Nov. 9, 2017

(51) Int. Cl.
| | | |
|---|---|---|
| H01L 47/00 | (2006.01) | |
| H01L 45/00 | (2006.01) | |
| G11C 13/00 | (2006.01) | |

(52) U.S. Cl.
CPC ...... *H01L 45/1233* (2013.01); *G11C 13/0002* (2013.01); *H01L 45/04* (2013.01); *H01L 45/146* (2013.01); *H01L 45/147* (2013.01); *H01L 45/165* (2013.01); *H01L 45/1641* (2013.01); *G11C 2213/31* (2013.01); *G11C 2213/32* (2013.01)

(58) Field of Classification Search
CPC .................................................. H01L 45/146
See application file for complete search history.

(56) References Cited

U.S. PATENT DOCUMENTS

| | | |
|---|---|---|
| 7,326,979 B2 | 2/2008 | Rinerson et al. |
| 8,686,389 B1 | 4/2014 | Wang et al. |
| 8,822,265 B2 | 9/2014 | Phatak et al. |
| 9,012,260 B2 | 4/2015 | Barabash et al. |
| 9,047,940 B2 | 6/2015 | Nardi et al. |
| 2015/0333105 A1* | 11/2015 | Matamis ............. H01L 45/1233 257/4 |

OTHER PUBLICATIONS

Improving the electrical performance of resistive switching memory using doping technology—http://download.springer.com/static/pdf/ 159/art%253A10.1007%252Fs11434-011-4930-0.pdf?originUrl= http%3A%2F%2Flink.springer.com%2Farticle%2F10.1007% 2Fs11434-011-4930-0&token2=exp=1441265797~acl=% 2Fstatic%2Fpdf%2F159%2Fart%25253A10.1007%25252- Fs11434-011-4930-0.pdf%3ForiginUrl%3Dhttp%253A% 252F%252Flink.springer.com%252Farticle%252F10.1007%.

(Continued)

*Primary Examiner* — Samuel Gebremariam
(74) *Attorney, Agent, or Firm* — Patterson & Sheridan, LLP; Steven Versteeg

(57) ABSTRACT

An apparatus for non-volatile memory, and more specifically a ReRAM device with a buried resistive memory cell. The memory cell includes a first contact disposed on a substrate, an active layer, a second contact, a first diffused zone disposed within the active layer, a second diffused zone disposed within the active layer, and an active switching zone disposed within the active layer in between the first diffused zone and the second diffused zone. In one embodiment, the active zone may be doped by diffusion or ion implantation and/or may be fabricated utilizing a self-aligned process. In another embodiment, the memory cell may combine a deep implant and shallow diffusion well to create the active zone. The vertically and laterally isolated buried resistive memory cell concentrates the electric field away from the edges of the device and eliminates the effects of interface impurities and contaminants.

7 Claims, 3 Drawing Sheets

(56) References Cited

OTHER PUBLICATIONS

Improved Resistance Switching Characteristics in Ti-Doped Yb 2 O 3 for Resistive Nonvolatile Memory Devices—http://www.researchgate.net/publication/232028387_Improved_Resistance_Switching_Characteristics_in_Ti-Doped_Yb_2_O_3_for_Resistive_Nonvolatile_Memory_Devices.
Studies of resistance switching effects in metal/YBa2Cu3O7—x interface junctions—http://arxiv.org/ftp/arxiv/papers/1004/1004.3909.pdf.

* cited by examiner

DIFFUSED RESISTIVE MEMORY CELL WITH BURIED ACTIVE ZONE

BACKGROUND OF THE DISCLOSURE

Field of the Disclosure

Embodiments of the present disclosure generally relate to non-volatile memory, and more specifically to the fabrication of memory elements.

Description of the Related Art

Non-volatile memory is memory that does not require a continuous power supply to retain information. Non-volatile memory may be used for secondary storage or long-term persistent storage. The constantly increasing speed of electronic devices and storage demand drive new requirements for non-volatile memory. Resistive RAM (ReRAM) is one of the leading candidates for high density non-volatile memory.

Resistive memory devices, e.g. resistive switching non-volatile random access memory (ReRAM), are formed using memory elements that have two or more stable states with different resistances. Bi-stable memory has two stable states. A bi-stable memory element can be placed in a high resistance state or a low resistance state by application of suitable voltages or currents. Voltage or current pulses are typically used to switch the memory element from one resistance state to the other. Some kinds of resistive RAM are initially insulating, but a sufficient voltage (known as a forming voltage) applied to the resistive switching material will form one or more conductive pathways in the resistive switching material to prepare a memory device for use.

However, production of ReRAM devices in large quantities is difficult because the behavior of individual cells scatters widely as it is not defined by the material and the geometry, but by random effects. For example impurities or contaminants form as devices are milled into individual units. These contaminants occur in some devices near the edges, where electric fields are the strongest, and/or near the lithographically defined interfaces causing undesired switching. As such, there exists a large variability of electrical properties of individual cells in the fabrication of large arrays.

Thus, there is a need for an improved resistive switching non-volatile random access memory device.

SUMMARY OF THE DISCLOSURE

The present disclosure generally relates to an apparatus for non-volatile memory, and more specifically a ReRAM device with a buried resistive memory cell. The memory cell includes a first contact disposed on a substrate, an active layer, a second contact, a first diffused zone disposed within the active layer, a second diffused zone disposed within the active layer, and an active switching zone disposed within the active layer in between the first diffused zone and the second diffused zone. In one embodiment, the active zone may be doped by diffusion or ion implantation and/or may be fabricated utilizing a self-aligned process. In another embodiment, the memory cell may combine a deep implant and shallow diffusion well to create the active zone. The vertically and laterally isolated buried resistive memory cell concentrates the electric field away from the edges of the device and eliminates the effects of interface impurities and contaminants. Also, by doping the properties of the material are modified such that areas predominantly affected by impurities do not show resistive switching and instead remain inactive.

In one embodiment, a ReRAM device may include a first contact, a second contact, and an active layer disposed in between the first contact and the second contact. The active layer may include an additional diffused zone adjacent the first contact. The diffused zone has a first composition. The active layer may also include an active zone disposed in between the diffused zone and the second contact. The active zone has a second composition different from the first composition of the diffused zone.

In another embodiment, a ReRAM device may include a first contact, a second contact, and an active layer disposed in between the first contact and the second contact. The active layer may include a first diffused zone adjacent the first contact. The first diffused zone has a first composition. The active layer may also include a second diffused zone adjacent the second contact. The second diffused zone has a second composition. The active layer may also include an active zone disposed in between the first diffused zone and the second diffused zone. The active zone has a third composition different from the first composition of the diffused zone.

In another embodiment, a ReRAM device may include a first contact, a second contact, and an active layer. The first contact and the second contact may be disposed on the active layer. The active layer may include a first diffused zone adjacent the first contact. The first diffused zone has a first composition. The active layer may also include a second diffused zone adjacent the second contact. The second diffused zone has a second composition. The active layer may also include an active zone disposed in between the first diffused zone and the second diffused zone. The active zone has a third composition different from the first composition of the first diffused zone. The active layer may also include a non-active zone disposed on top of the active zone.

In another embodiment, a ReRAM device may include a first contact, a second contact, and an active layer. The first contact and the second contact may be disposed on the active layer. The active layer may include a first diffused zone implanted within the active layer and adjacent the first contact. The first diffused zone has a first composition. The active layer may also include a second diffused zone implanted within the active layer and adjacent the second contact. The second diffused zone has a second composition. The active layer may also include an active zone disposed in between the first diffused zone and the second diffused zone. The active zone has a third composition that is different from the first composition of the first diffused zone.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure relates to an apparatus for non-volatile memory, and more specifically a resistive random access memory (ReRAM) device with a buried resistive memory cell. The memory cell includes a first contact disposed on a substrate, an active layer, a second contact, a first diffused zone disposed within the active layer, a second diffused zone disposed within the active layer, and an active switching zone disposed within the active layer in between the first diffused zone and the second diffused zone. In one embodiment, the active zone may be doped by diffusion or ion implantation and/or may be fabricated utilizing a self-aligned process. In another embodiment, the memory cell may combine a deep implant and shallow diffusion well to create the active zone. The vertically and laterally isolated buried resistive memory cell concentrates the electric field away from the edges of the device and eliminates the effects of interface impurities and contaminants. Also, by doping, the properties of the material are modified such that areas predominantly affected by impurities do not show resistive switching and instead remain inactive.

Figure 1:
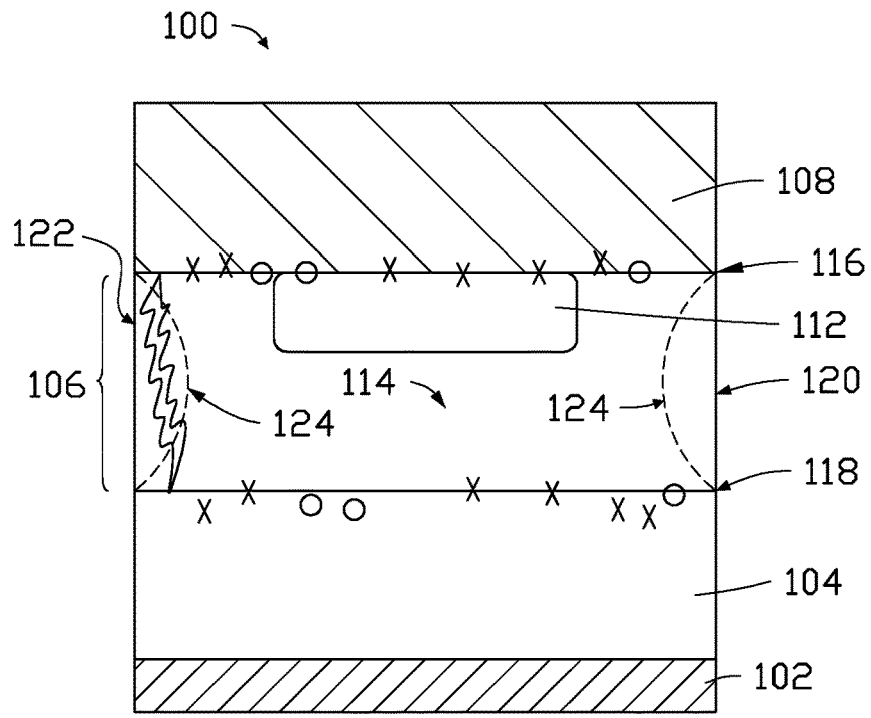
FIG. 1 shows a schematic illustration of a ReRAM memory device according to one embodiment.

FIG. 1 shows a schematic illustration of a ReRAM memory device 100 according to one embodiment. The ReRAM memory device 100 may include a substrate 102, a first contact 108, a second contact 104, and an active layer 106. The substrate 102 may be a silicon substrate including one or more layers. The substrate 102 is not intended to be limited to a single layer or a silicon substrate. Rather, the substrate 102 represents one or more layers that may be present in CMOS fabrication. The active layer 106 may be disposed in between the first contact 108 and the second contact 104.

The first contact 108 may include a metal selected from a group consisting of aluminum (Al), tantalum (Ta), indium (In), hafnium (Hf), platinum (Pt), gold (Au), silver (Ag), tungsten (W), magnesium (Mg), zirconium (Zr), europium (Eu), lanthanum (La), titanium nitride (TiN), or their alloys. The second contact 104 may be disposed on the substrate 102. The second contact may include a metal selected from a group consisting of aluminum (Al), tantalum (Ta), indium (In), hafnium (Hf), platinum (Pt), gold (Au), silver (Ag), tungsten (W), magnesium (Mg), zirconium (Zr), europium (Eu), lanthanum (La), titanium nitride (TiN), tin (Sn), copper (Cu), germanium (Ge), or their alloys.

The active layer 106 may be disposed on the second contact 104. The active layer may have an oxygen or dopant concentration that varies between the first contact 108 and the second contact 104. The active layer 106 may be binary or complex metal oxide material selected from the group consisting of tantalum oxide, hafnium oxide, titanium oxide, zirconium dioxide, aluminum oxide, titanium dioxide, or zinc oxide. The active layer may also be selected from the group of complex oxides, such as manganates, cuprates or nickelates. The active layer 106 may include a diffused zone 112 adjacent to the first contact 108 and an active zone 114 disposed in between the diffused zone 112 and the second contact 104. The diffused zone 112 may have a different composition than the active zone 112. It should be understood that the active zone 114 is the memory element capable of switching from a low resistive state to a high resistive state or vice versa.

The diffused zone 112 may comprise a metal or alloy containing elements selected from the group consisting of aluminum, tantalum, indium, tin, silver, copper, germanium, or hafnium. In one embodiment, the diffused zone 112 is diffused from the first contact 108. In one embodiment, the diffusion of the diffused zone 112 may be completed after the individual devices are milled from the entire wafer. In another embodiment, a hard mask patterning or ion deposition may be used to deposit the diffused zone 112 in the active layer 106 prior to the deposition of the first contact 108. In one embodiment, the combination of the diffused zone 112 and the oxygen gradient in the active layer 106 creates the active zone 114. The milling process creates contaminants—shown as a lightning bolt—near the edges, where electric fields are the strongest, and/or near the lithographically defined interfaces, shown as "x" and "o" in FIG. 1. As such, the diffused zone 112 advantageously moves the active zone 114 away from a first interface 108 formed by the first contact 108 and the active layer 106. The concentration gradient in the active layer 106 advantageously moves the active zone 114 away from a second interface 118 formed by the second contact 104 and the active layer 106.

In one embodiment, the ReRAM device 100 is exposed to oxygen to perform a sidewall oxidation exposing active material near a first surface 120 and a second surface 122. The exposure to oxygen transforms a portion 124 of the active layer 106 into a highly insulating portion and advantageously provides for the active zone 114 to be disposed in the middle of active layer 106. In other words, the active layer 106 is disposed away from contaminates created near the first surface 120 and second surface 122. Having the active zone 114 located substantially centrally in the active layer 106 advantageously and specifically defines the switching element eliminating electrical field edge effects and provides for consistency in the manufacturing of individual devices.

Figure 2:
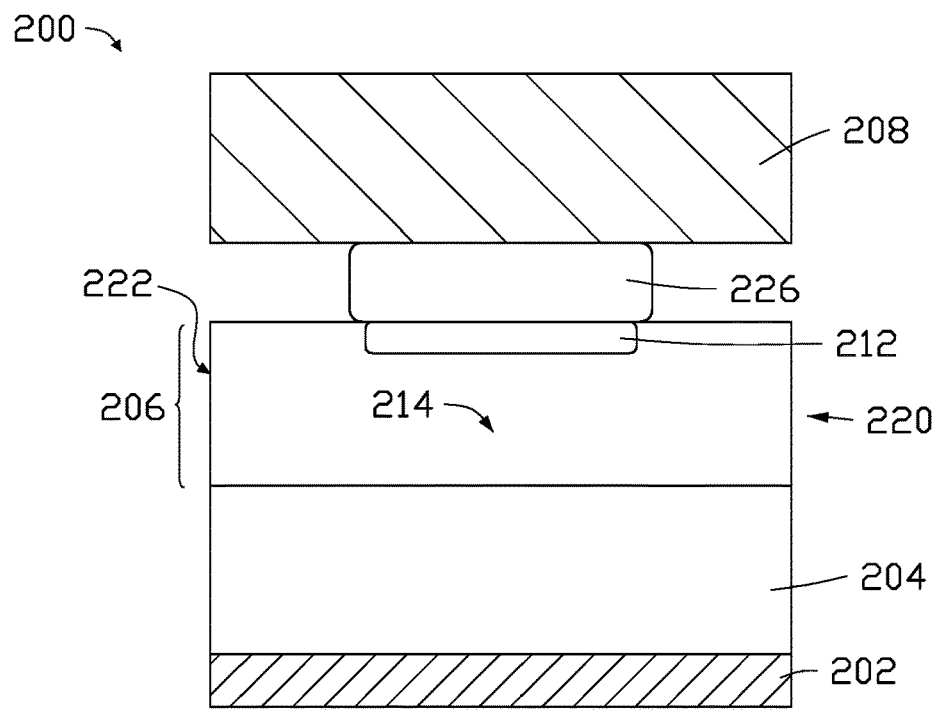
FIG. 2 shows a schematic illustration of a ReRAM memory device according to another embodiment.

FIG. 2 shows a schematic illustration of a ReRAM memory device 200 with a self-aligned doping material 226. It should be understood that the ReRAM memory device 200 is substantially similar to the ReRAM memory device 100. The ReRAM memory device 200 may include a first contact 208, an active layer 206, a second contact 204, and a substrate 202. The substrate 202 may be substantially similar to the substrate 102. The first contact 208 may be substantially similar to the first contact 108. The second contact 204 may be substantially similar to the second contact 104.

The doping material 226 may be placed in between the active layer 206 and the first contact 208. The active layer 206 may be substantially similar to the active layer 106 and may include a diffused zone 212, and active zone 214. The diffused zone 212 may be diffused from the doping material 226. As such, the diffused zone 212 may be created below the doping material 226. The doping material 226 may be selected from the group consisting of aluminum, tantalum, indium, tin, silver, copper, germanium, hafnium, or may be an alloy containing one or more of these elements. After the diffusion, the doping material 226 serves as part of the first contact 208. In one embodiment, the ReRAM device 200 is exposed to oxygen to perform a sidewall oxidation destroying the exposed metal near a first surface 220 and a second surface 222 and limiting the lateral extension of the ReRAM device 200 as described above for FIG. 1.

Figure 3:
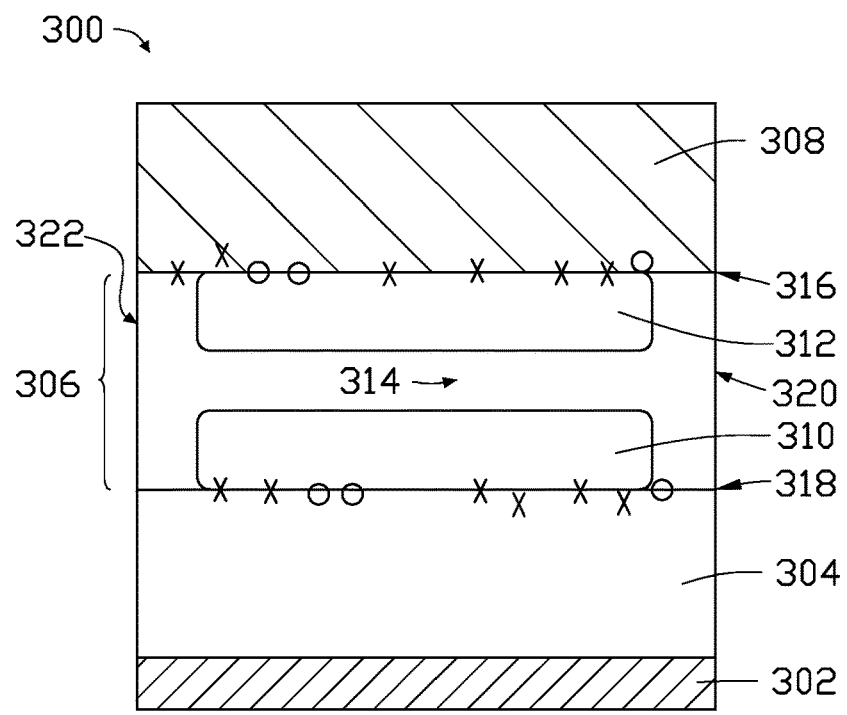
FIG. 3 shows a schematic illustration of a ReRAM memory device according to another embodiment.

FIG. 3 shows a schematic illustration of a ReRAM memory device 300 according to another embodiment. It should be understood that the ReRAM memory device 300 is substantially similar to the ReRAM memory device 100. The ReRAM memory device 300 may include a first contact 308, an active layer 306, a second contact 304, and a substrate 302. The substrate 302 may be substantially similar to the substrate 102. The first contact 308 may be substantially similar to the first contact 108. The second contact 304 may be substantially similar to the second contact 104.

The active layer 306 may have an oxygen or doping concentration that changes between the first contact 308 and the second contact 304. The active layer 306 may include a binary oxide or a mixture of such selected from the group consisting of tantalum oxide, hafnium oxide, titanium oxide, zirconium dioxide, aluminum oxide, titanium dioxide, or zinc oxide. The active layer 306 may also be selected from the group of complex oxides, such as manganates, cuprates or nickelates. The active layer 306 may include a first diffused zone 312 adjacent to the first contact 308, a second diffused zone 310 adjacent to the second contact 304, and an active zone 314 disposed in between the first diffused zone 312 and the second diffused zone 310. The active zone 314 may have a different composition than the first diffused zone 312. In another embodiment, the active zone 314 has a different composition than the second diffused zone 310. The first diffused zone 312 and the second diffused zone 310 may include the same metal or may include different metals. In one embodiment, the first diffused zone 312 has a different composition than the second diffused zone 310. It should be understood that the active zone 314 is the memory element capable of switching from a low resistive state to a high resistive state or vice versa.

The first diffused zone 312 may be substantially similar to the diffused zone 112. The second diffused zone 310 may comprise a metal or metal alloy selected from the group consisting of aluminum, tantalum, indium, tin, silver, copper, germanium, or hafnium. In one embodiment, the second diffused zone 310 is diffused from the second contact 304. In one embodiment, the diffusion of the second diffused zone 310 may be completed after the individual devices are milled from the entire wafer. In another embodiment, a hard mask patterning or ion deposition may be used to deposit the second diffused zone 310 in the active layer 306 prior to the deposition of the first contact 308. In one embodiment, the combination of the first diffused zone 312 and the second diffused zone 310 in the active layer 106 creates the active zone 314.

The milling process creates contaminants—shown as a lightning bolt—near the edges, where electric fields are the strongest, and/or near the lithographically defined interfaces, shown as "x" and "o" in FIG. 1. As such, the first diffused zone 312 advantageously moves the active zone 314 away from a first interface 316 formed by the first contact 308 and the active layer 306. The second diffused zone 310 in the active layer 306 advantageously moves the active zone 314 away from a second interface 318 formed by the second contact 304 and the active layer 306. In one embodiment, the ReRAM device 300 is exposed to oxygen to perform a sidewall oxidation inactivating the active material near a first surface 320 and a second surface 322 as described above for FIG. 1.

Figure 4:
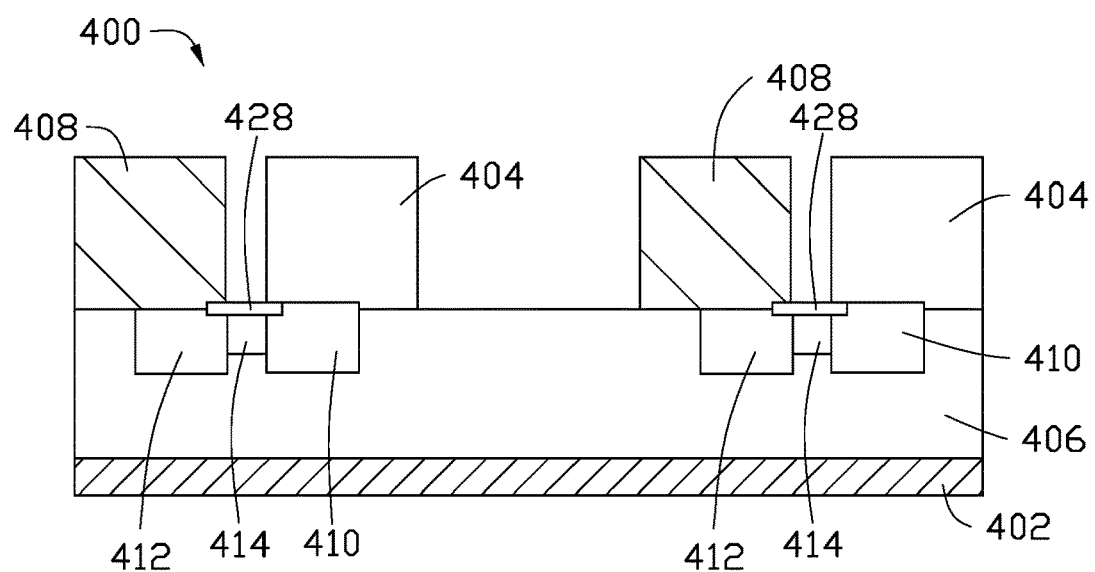
FIG. 4 shows a schematic cross-section of a lateral ReRAM memory device according to one embodiment.

FIG. 4 shows a schematic cross-section of a lateral ReRAM memory device 400 according to one embodiment. FIG. 4 shows two individual units. The ReRAM memory device 400 may be formed advantageously without having to first mill individual units. The ReRAM memory device 400 may include a first contact 408, a second contact 404, an active layer 406, and a substrate 402. The substrate 402 may be substantially similar to the substrate 102.

The first contact 408 and the second contact 404 may be disposed on the active layer 406. The first contact 408 may be disposed laterally adjacent to the second contact 404. The first contact 408 and the second contact 404 may include a metal selected from the group consisting of aluminum (Al), tantalum (Ta), indium (In), hafnium (Hf), platinum (Pt), gold (Au), silver (Ag), tungsten (W), magnesium (Mg), zirconium (Zr), europium (Eu), lanthanum (La), titanium nitride (TiN), tin (Sn), copper (Cu), germanium (Ge), or their alloys.

The active layer 406 may include a first diffused zone 412, a second diffused zone 410, an active zone 414, and a non-active zone 428. The active layer 406 may include a binary or complex metal oxide material selected from a group consisting of tantalum oxide, hafnium oxide, titanium oxide, zirconium dioxide, aluminum oxide, titanium dioxide, zinc oxide, manganates, cuprates, or nickelates. In one embodiment, the active layer 406 has an oxygen or doping gradient between the top and bottom surface. In other words, there may be a different concentration of oxygen or dopants near the area of the active layer 406 adjacent to the first contact 408 than the area of the active layer 406 adjacent the substrate 402.

The first diffused zone 412 and the second diffused zone 410 may comprise a metal or metal alloy selected from the group consisting of aluminum, tantalum, indium, tin, silver, copper, germanium, or hafnium. In one embodiment, the first diffused zone 412 and the second diffused zone 410 include the same metal. In another embodiment, the first diffused zone 412 and the second diffused zone 410 comprise a different metal. In one embodiment, the first diffused zone 412 and the second diffused zone 410 are diffused into the active layer 406. The first diffused zone 412 may be laterally disposed from the second diffused zone 410. The first diffused zone 412 may be adjacent to and in contact with the first contact 408. The second diffused zone 410 may be adjacent to and in contact with the second contact 404. In another embodiment, the first diffused zone 412 and the second diffused zone 410 are formed using ion implantation. In one embodiment, the active zone 414 is disposed in between the first diffused zone 412 and the second diffused zone 410. The non-active zone 428 may be disposed on top of the active zone 414 in between the first contact 408 and the second contact 404.

A light doping may be performed in between the first diffused zone 412 and the second diffused zone 410 to define the active zone 414. The active zone 414 may comprise a metal or metal alloy selected from the group consisting of aluminum, tantalum, indium, tin, silver, copper, germanium, or hafnium. In one embodiment, the composition of the active zone 414 is different from the composition of the first diffused zone 412. In one embodiment, the concentration of metal in the first diffused zone 412 is higher than in the active zone 414. It should be understood that the active zone 414 is the memory element capable of switching from a low resistive state to a high resistive state or vice versa. The non-active zone 428 may be disposed on top of the active zone 414. The non-active zone 428 may be made inactive by oxidation, ion implantation, or doping. The non-active zone 428 may have a greater oxygen content as compared to the active zone 414.

Figure 5:
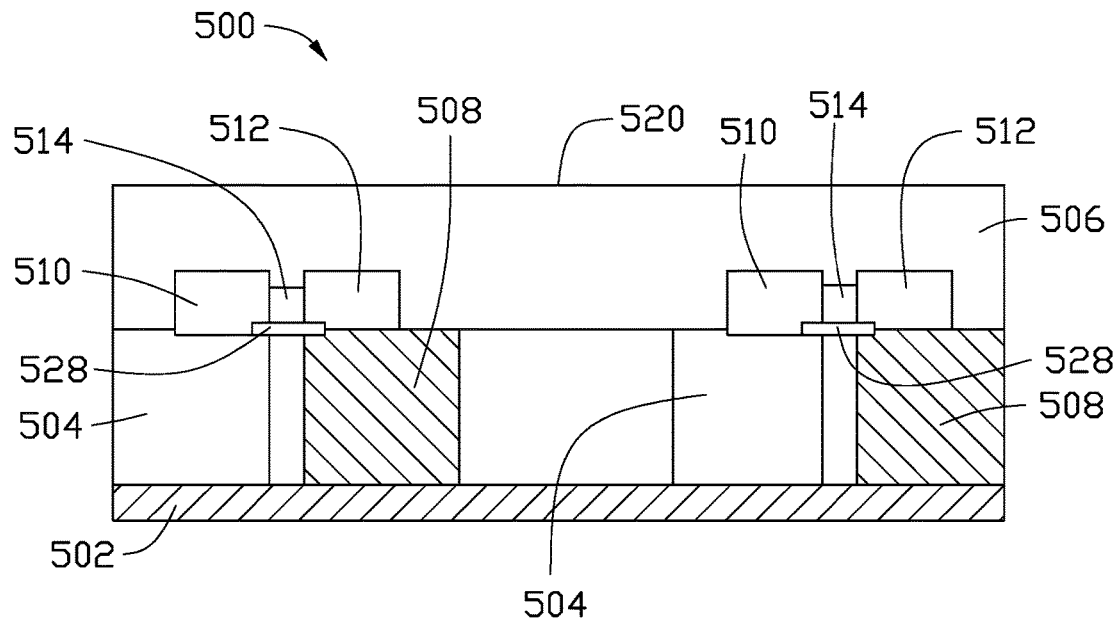
FIG. 5 shows a schematic cross-section of a lateral ReRAM memory device according to another embodiment.

FIG. 5 shows a schematic cross-section of a lateral ReRAM memory device 500 according to another embodiment. FIG. 5 shows two individual units. The ReRAM memory device 500 may be formed advantageously without having to first mill individual units. The ReRAM memory device 500 may include a first contact 508, a second contact 504, an active layer 506, and a substrate 502. The substrate 502 may be substantially similar to the substrate 102.

The first contact 508 and the second contact 504 may be disposed on the substrate 502. The first contact 508 and the second contact 504 may be disposed between the substrate 502 and the active layer 506. The first contact 508 may be disposed laterally adjacent to the second contact 504. The first contact 508 and the second contact 504 may include similar material to first contact 408 and second contact 404.

The active layer 506 may include a first diffused zone 512, a second diffused zone 510, an active zone 514, an area 520, and a non-active zone 528. The area 520 may be disposed opposite to the non-active zone 528. The active layer 506 may include a material similar to the active layer 406. In one embodiment, the active layer 506 has an oxygen or dopant gradient between the top and bottom surface. In other words, there may be a different concentration of oxygen or dopants near the area of the active layer 506 adjacent to the first contact 508 than that of the area 520 of the active layer 506.

The first diffused zone 512 and the second diffused zone 510 may comprise a material similar to the first diffused zone 412 and the second diffused zone 410. In one embodiment, the first diffused zone 512 and the second diffused zone 510 include the same metal. In another embodiment, the first diffused zone 512 and the second diffused zone 510 comprise a different metal. In one embodiment, the first diffused zone 512 and the second diffused zone 510 are diffused into the active layer 506. The first diffused zone 512 may be laterally disposed from the second diffused zone 510. The first diffused zone 512 may be adjacent to and in contact with the first contact 508. The second diffused zone 510 may be adjacent to and in contact with the second contact 504. In another embodiment, the first diffused zone 512 and the second diffused zone 510 are formed using ion implantation. In one embodiment, the active zone 514 is disposed in between the first diffused zone 512 and the second diffused zone 510 within the active layer 506. The non-active zone 528 may be disposed adjacent to the active zone 514 in between the first contact 508 and the second contact 504.

A light doping may be performed in between the first diffused zone 512 and the second diffused zone 510 to define the active zone 514. The active zone 514 may comprise a metal or metal alloy selected from the group consisting of aluminum, tantalum, indium, tin, silver, copper, germanium, or hafnium. In one embodiment, the composition of the active zone 514 is different from the composition of the first diffused zone 512. In one embodiment, the concentration of metal in the first diffused zone 512 is higher than in the active zone 514. It should be understood that the active zone 514 is the memory element capable of switching from a low resistive state to a high resistive state or vice versa. The non-active zone 528 may be disposed adjacent to the active zone 514. The non-active zone 528 may be made inactive by oxidation, ion implantation, or doping. The non-active zone 528 may have a greater oxygen content as compared to the active zone 514.

The lateral ReRAM memory device 400, 500 may advantageously be formed through a self-aligned process limiting the number of lithography steps. The fewer steps involved thus reduces the cost of manufacturing. Additionally, the ReRAM memory device 400, 500 include a buried switching zone such that the active layer is not exposed during processing and such that any defects present will not affect the centrally located active switching zone. Furthermore, the ReRAM memory device 400, 500 may advantageously be formed as a back end of line process.

Figure 6:
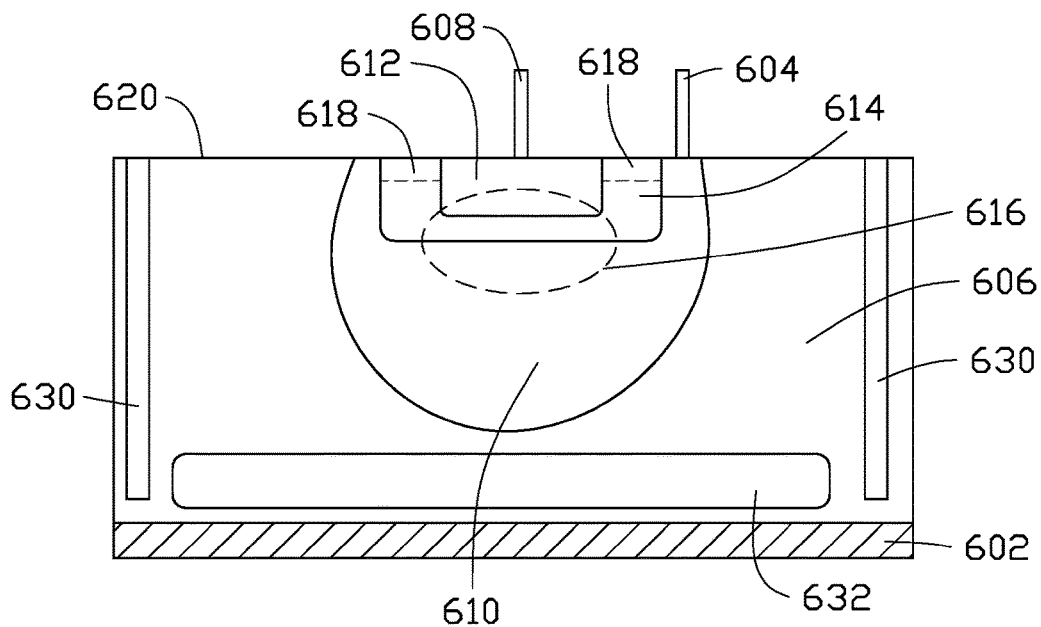
FIG. 6 shows a schematic cross-section of a buried ReRAM memory device according to one embodiment.

FIG. 6 shows a schematic cross-section of a buried ReRAM memory device 600 according to one embodiment. The buried ReRAM memory device 600 may include a first contact 608, a second contact 604, an active layer 606, and a substrate 602. The substrate 602 may be substantially similar to the substrate 102. In one embodiment, the active layer 606 is disposed on the substrate 602.

The first contact 608 and the second contact 604 may be disposed on the active layer 606. The first contact 608 may be disposed laterally adjacent to the second contact 604. The first contact 608 may be disposed adjacent to and in contact with the first diffused zone 612. The second contact 604 may be disposed adjacent to and in contact with the second diffused zone 610. The first contact 608 and the second contact 604 may include a metal selected from the group consisting of aluminum (Al), tantalum (Ta), indium (In), hafnium (Hf), platinum (Pt), gold (Au), silver (Ag), tungsten (W), magnesium (Mg), zirconium (Zr), europium (Eu), lanthanum (La), titanium nitride (TiN), or their alloys.

The active layer 606 may include a first diffused zone 612, a second diffused zone 610, and an active zone 614 disposed in between the first diffused zone 612 and the second diffused zone 610. The composition of the active zone 614 of the area 618 near or adjacent to the surface 620 may be modified to have a composition different from that of the active switching zone 616. The area 618 of the active zone 614 near or adjacent to the surface 620 may be made inactive by oxidation, ion implantation, or doping. The non-active area 618 may be adjacent the upper surface of the second diffused zone 610 and adjacent the second contact 604. In one embodiment, the non-active area 618 may have a greater oxygen content as compared to the active zone 614.

The second diffused zone 610 may be implanted within the active layer 606 and adjacent to the second contact 604. The active layer 606 may be a binary or complex metal oxide material selected from a group consisting of tantalum oxide, hafnium oxide, titanium oxide, zirconium dioxide, aluminum oxide, titanium dioxide, zinc oxide, manganates, cuprates, or nickelates. In one embodiment, the active layer 606 has an oxygen or dopant concentration gradient. The oxygen or dopant concentration may change between the first contact 608 and the substrate 602. In other words, the active layer 606 adjacent to the first contact 608 may have a different oxidation state than the active layer 606 adjacent the substrate 602.

In one embodiment, the active layer 606 may also include an isolation trench 630. The isolation trench 630 may be disposed lateral to the second diffused zone 610. In one embodiment, the isolation trench 630 may be disposed in the active layer 606. The active layer 606 may also include a buried isolation layer 632 to isolate the active zone 614 from underlying material. The buried isolation layer 632 may be disposed below the second diffused zone 610 and orthogonal to the isolation trench 630. In one embodiment, the buried ReRAM memory device 600 may have both the isolation trench 630 and the buried isolation trench 632. In another embodiment, the buried ReRAM memory device 600 has either the isolation trench 630 or the buried isolation trench 632.

The first diffused zone 612 and the second diffused zone 612 together isolate the active zone 614. The first diffused zone 612 may be disposed within the active layer by deep implantation. The first diffused zone 612 may comprise a metal or metal alloy selected from the group consisting of aluminum, tantalum, indium, silver, tin, copper, germanium, or hafnium. The active zone 614 has a composition that is different from the first diffused zone 612. The active zone 614 has a composition that is different from the second diffused zone 610. The active zone 614 may comprise a metal or metal alloy selected from the group consisting of aluminum, tantalum, indium, tin, silver, copper, germanium, or hafnium. The active zone 614 has a higher dopant concentration than either the first diffused zone 612 or the second diffused zone 610. It should be understood that the active zone 614 is the memory element capable of switching from a low resistive state to a high resistive state or vice versa. The first diffused zone 612 may comprise a shallow diffusion of dopant. The second diffused zone 610 may comprise a metal or metal alloy selected from the group consisting of aluminum, tantalum, indium, tin, silver, copper, germanium, or hafnium.

The combination of the deep implant and shallow diffusion well bury the active zone away from impurities and contaminants located near the surface. Thus, the buried active zone advantageously possesses stable long-term performance.

The various embodiments of the ReRAM memory device each advantageously vertically and laterally isolate or bury the active switching memory element. By doing so, the resistive memory cell concentrates the electric field away from the edges of the device and eliminates the effects of interface impurities and contaminants.

While the foregoing is directed to embodiments of the present disclosure, other and further embodiments of the disclosure may be devised without departing from the basic scope thereof, and the scope thereof is determined by the claims that follow.

What is claimed is:

1. A ReRAM device, comprising:
   a first contact;
   a second contact; and
   an active layer disposed between the first contact and the second contact, wherein the active layer comprises:
      a diffused zone adjacent the first contact, wherein the diffused zone has a first composition; and
      an active zone disposed between the diffused zone and the second contact, wherein the active zone has a second composition different from the first composition of the diffused zone, wherein the diffused zone is placed within the active layer and wherein the diffused zone has at least one side and one bottom surface contacting the active layer.

2. The device of claim 1, wherein the active zone comprises a binary or complex metal oxide material selected from the group consisting of tantalum oxide, hafnium oxide, titanium oxide, zirconium dioxide, aluminum oxide, titanium dioxide, zinc oxide, manganates, cuprates, or nickelates.

3. The device of claim 2, wherein the diffused zone comprises a metal or metal alloy selected from the group consisting of aluminum, tantalum, indium, tin, silver, copper, germanium, or hafnium.

4. The device of claim 1, wherein the diffused zone comprises a metal or metal alloy selected from the group consisting of aluminum, tantalum, indium, tin, silver, copper, germanium or hafnium.

5. The device of claim 1, wherein the active layer that has a gradient that changes from the first contact to the second contact.

6. The device of claim 5, wherein the gradient is an oxygen gradient.

7. A ReRAM device, comprising:
   a first contact;
   a second contact; and
   an active layer disposed between the first contact and the second contact, wherein the active layer has an oxygen gradient, wherein the active layer comprises:
      a diffused zone adjacent the first contact, wherein the diffused zone has a first composition; and
      an active zone disposed between the diffused zone and the second contact, wherein the active zone has a second composition different from the first composition of the diffused zone wherein the gradient is created by a dopant selected from the group consisting of indium or silicon.

* * * * *